United States Patent
Jeong

(10) Patent No.: US 10,957,867 B2
(45) Date of Patent: Mar. 23, 2021

(54) DISPLAY DEVICE

(71) Applicant: Samsung Display Co., Ltd., Yongin-si (KR)

(72) Inventor: Gyeongho Jeong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 129 days.

(21) Appl. No.: 16/213,304

(22) Filed: Dec. 7, 2018

(65) Prior Publication Data

US 2019/0181364 A1  Jun. 13, 2019

(30) Foreign Application Priority Data

Dec. 11, 2017 (KR) .......................... 10-2017-0169297

(51) Int. Cl.
*H01L 29/08* (2006.01)
*H01L 51/00* (2006.01)
(Continued)

(52) U.S. Cl.
CPC ............ *H01L 51/0097* (2013.01); *B32B 7/12* (2013.01); *G06F 1/1618* (2013.01); *G06F 1/1626* (2013.01); *G06F 1/1637* (2013.01); *G06F 1/1641* (2013.01); *G06F 1/1643* (2013.01); *G06F 1/1652* (2013.01); *H01L 27/323* (2013.01); *H01L 27/3244* (2013.01); *H01L 51/524* (2013.01); *H01L 51/5253* (2013.01); *B32B 2457/206* (2013.01); *B32B 2457/208* (2013.01); *G06F 3/041* (2013.01); *G06F 2203/04102* (2013.01); *G09G 3/3233* (2013.01); *G09G 2380/02* (2013.01);
(Continued)

(58) Field of Classification Search
CPC ......... H01L 51/0097; H01L 2251/5338; H01L 51/5253; H01L 27/3244; H01L 27/323; H01L 51/524; H01L 2251/558; H01L 27/3276; G06F 2203/04102; G06F 3/041; G06F 1/1626; G06F 1/1641; G06F 1/1637; G06F 1/1652; G06F 1/1618; G06F 1/1643; G09G 3/3233; G09G 2380/02; B32B 2457/208; B32B 7/12; B32B 2457/206
USPC ........................................................ 257/40
See application file for complete search history.

(56) References Cited

U.S. PATENT DOCUMENTS 9,326,375 B2 * 4/2016 Lee .................... G02F 1/133305
9,356,087 B1 * 5/2016 Lee ...................... H01L 27/3279
(Continued)

FOREIGN PATENT DOCUMENTS

KR  10-2016-0090471 A  8/2016
KR  10-2017-0015599 A  2/2017

*Primary Examiner* — Caleb E Henry
(74) *Attorney, Agent, or Firm* — Lewis Roca Rothgerber Christie LLP

(57) ABSTRACT

A display device includes a display module, a protective member under the display module, and an adhesive member between the display module and the protective member. The display module includes a folding area foldable along a folding axis, a first non-folding area, and a second non-folding area, and the folding area is between the first and second non-folding areas. A first thickness of the protective member overlapping with the folding area is less than a second thickness of the protective member overlapping with the first non-folding area and a third thickness of the protective member overlapping with the second non-folding area.

19 Claims, 12 Drawing Sheets

(51) Int. Cl.
*H01L 27/32* (2006.01)
*H01L 51/52* (2006.01)
*B32B 7/12* (2006.01)
*G06F 1/16* (2006.01)
*G09G 3/3233* (2016.01)
*G06F 3/041* (2006.01)

(52) U.S. Cl.
CPC .. *H01L 27/3276* (2013.01); *H01L 2251/5338* (2013.01); *H01L 2251/558* (2013.01)

(56) References Cited

U.S. PATENT DOCUMENTS

| | | | |
|---|---|---|---|
| 9,603,241 B2 | 3/2017 | Myung et al. | |
| 9,793,502 B2 * | 10/2017 | Saeki | H05K 999/99 |
| 9,989,791 B2 * | 6/2018 | Cheng | G02F 1/136286 |
| 10,496,136 B2 * | 12/2019 | Kim | H01L 27/3244 |
| 10,680,210 B2 * | 6/2020 | Lee | H01L 51/5237 |
| 10,707,194 B2 * | 7/2020 | Odaka | H01L 51/524 |
| 2012/0147599 A1 * | 6/2012 | Shim | G06F 1/1652 |
| | | | 362/231 |
| 2014/0042406 A1 * | 2/2014 | Degner | H01L 27/3297 |
| | | | 257/40 |
| 2014/0217382 A1 * | 8/2014 | Kwon | H01L 51/5246 |
| | | | 257/40 |
| 2014/0306941 A1 * | 10/2014 | Kim | H04M 1/0268 |
| | | | 345/204 |
| 2015/0036300 A1 * | 2/2015 | Park | H01L 51/5253 |
| | | | 361/749 |
| 2016/0212840 A1 | 7/2016 | Koo et al. | |
| 2016/0364044 A1 * | 12/2016 | Kim | H01L 51/0097 |
| 2017/0025634 A1 * | 1/2017 | Jeong | G06F 1/1652 |
| 2017/0047547 A1 * | 2/2017 | Son | H01L 25/167 |
| 2017/0064845 A1 * | 3/2017 | Jung | H05K 5/03 |
| 2017/0090661 A1 * | 3/2017 | Kim | G06F 3/0412 |
| 2017/0148859 A1 * | 5/2017 | Nishinohara | H01L 51/5256 |
| 2017/0293194 A1 * | 10/2017 | Hou | G02B 1/14 |
| 2018/0081399 A1 * | 3/2018 | Kwon | G09G 5/00 |
| 2018/0180911 A1 * | 6/2018 | Odaka | H01L 51/0097 |
| 2018/0196300 A1 * | 7/2018 | Jung | H01L 51/5237 |
| 2018/0212169 A1 | 7/2018 | Goto | H01L 51/5253 |
| 2019/0305238 A1 * | 10/2019 | Shin | H01L 27/323 |
| 2020/0103990 A1 * | 4/2020 | Park | G06F 1/1652 |

* cited by examiner

DISPLAY DEVICE

CROSS-REFERENCE TO RELATED APPLICATION

This application claims priority to and the benefit of Korean Patent Application No. 10-2017-0169297, filed in the Korean Intellectual Property Office on Dec. 11, 2017, the entire content of which is herein incorporated by reference.

BACKGROUND

1. Field

Example embodiments of the present invention relate to a display device.

2. Description of the Related Art

Various display devices used in multimedia devices, such as televisions, portable phones, tablet computers, navigation systems, and game consoles, have been developed. Display devices may include keyboards or mouses as input units (e.g., input devices). In addition, display devices may include input sensing units (e.g., input sensors or touch panels) as the input units.

Display devices having various shapes different from a flat display device have been developed recently. For example, various flexible display devices (e.g., a curved display device, a bendable display device, a foldable display device, a rollable display device, and a stretchable display device) have been developed. As one example, a display device that is foldable in two directions about a folding axis has been developed.

However, when the foldable display device is folded, stress occurring in a folding area may be greater than stress occurring in a non-folding area. Thus, a protective member of the foldable display device may be damaged or broken in the folding area.

SUMMARY

Embodiments of the present invention may provide a display device capable of being easily folded in two directions and of reducing damage to and/or preventing breakage of a protective member of the display device.

According to one embodiment of the present invention, a display device includes a display module, a protective member under the display module, and an adhesive member between the display module and the protective member. The display module includes a folding area foldable along a folding axis, a first non-folding area, and a second non-folding area. The folding area is between the first and second non-folding areas. A first thickness of the protective member overlapping with the folding area is less than a second thickness of the protective member overlapping with the first non-folding area and a third thickness of the protective member overlapping with the second non-folding area.

The protective member may include a top surface on the adhesive member, a bottom surface opposite to the top surface, and side surfaces extending between the top surface and the bottom surface. The top surface may have a concave shape recessed toward the bottom surface when viewed in a cross-sectional view perpendicular to the folding axis.

The bottom surface may have a concave shape recessed toward the top surface when viewed in the cross-sectional view.

The display device may further include a first adhesive in a recessed space defined by the top surface and a second adhesive in a recessed space defined by the bottom surface.

The first adhesive may be integral with the adhesive member.

The first adhesive may include a first adhesive portion in the recessed space defined by the top surface and a second adhesive portion including a substantially uniform thickness and extending from the first adhesive portion. The second adhesive may include a third adhesive portion in the recessed space defined by the bottom surface and a fourth adhesive portion including a substantially uniform thickness and extending from the third adhesive portion. The second adhesive portion may be the adhesive member.

The display device may further include a cushion under the second adhesive.

The display device may further include a first cushion in a recessed space defined by the top surface and a second cushion in a recessed space defined by the bottom surface.

The first cushion may include a first cushion portion in the recessed space defined by the top surface and a second cushion portion including a substantially uniform thickness and extending from the first cushion portion in a thickness direction of the display module.

The top surface may include a first opening overlapping with the folding area and recessed in a thickness direction of the display module.

The top surface may include a second opening overlapping with the first non-folding area or the second non-folding area and recessed in the thickness direction.

The bottom surface may include a second opening overlapping with the folding area and recessed in the thickness direction.

The second thickness of the protective member overlapping with the first non-folding area may increase as a distance from the folding area increases when viewed in a cross-sectional view perpendicular to the folding axis, and the third thickness of the protective member overlapping with the second non-folding area may increase as a distance from the folding area increases when viewed in the cross-sectional view.

The display module may include a first display surface overlapping with the folding area, a second display surface overlapping with the first non-folding area, and a third display surface overlapping with the second non-folding area.

The display module may be configured to be folded at the folding area along the folding axis such that the second display surface and the third display surface face each other.

The display module may be configured to be folded at the folding area along the folding axis such that the second display surface and the third display surface are exposed to an outside.

The protective member overlapping with the folding area may have a substantially uniform thickness in a thickness direction of the display module.

According to another embodiment of the present invention, a display device includes a folding area foldable along a folding axis and a non-folding area. The display device includes a display module, a protective member under the display module, a first adhesive member, a window member on the display module, and a second adhesive member between the window member and the display module. The display module includes a first display surface overlapping with the folding area and a second display surface overlapping with the non-folding area, and the protective member includes a top surface, a bottom surface, and side surfaces.

The first adhesive member is between the display module and the top surface of the protective member. Each of the top surface and the bottom surface of the protective member has a concave shape when viewed in a cross-sectional view perpendicular to the folding axis.

The display module may include a display panel configured to display first and second images at the first and second display surfaces, respectively, and an input sensing unit on the display panel.

The non-folding area may include a first non-folding area and a second non-folding area, and the folding area may be between the first and second non-folding areas.

BRIEF DESCRIPTION OF THE DRAWINGS

The above and other aspects and features of the present invention will become more apparent by describing, in further detail, exemplary embodiments thereof with reference to the accompanying drawings, in which.

DETAILED DESCRIPTION

Figure 1:
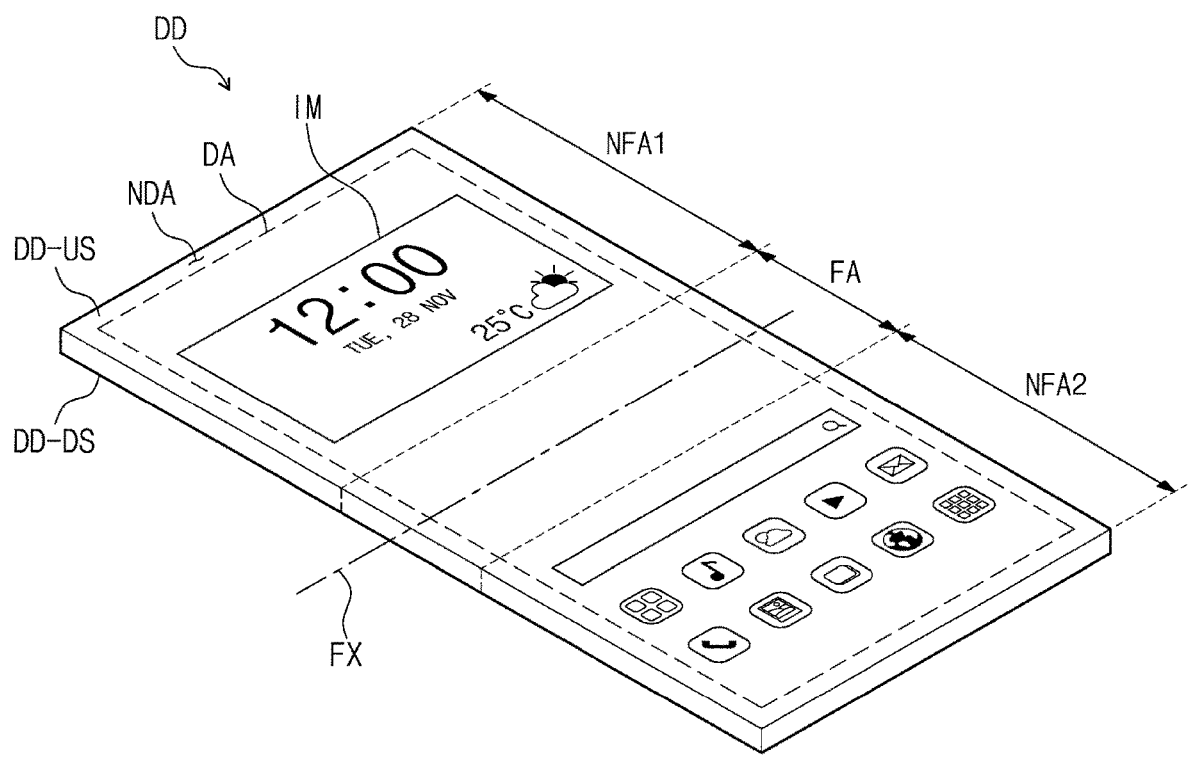
FIG. 1 is a perspective view illustrating a display device according to an embodiment of the present invention.

The present invention now will be described more fully hereinafter with reference to the accompanying drawings, in which various embodiments are shown. The present invention may, however, be embodied in many different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout. It will be understood that when an element, such as a layer, region, or substrate, is referred to as being "on" another element, it can be directly on the other element or intervening elements may be present. The term "directly" means that there are no intervening elements. As used herein, the term "and/or" includes any and all combinations of one or more of the associated listed items. The terminology used herein is for the purpose of describing particular embodiments only and is not intended to be limiting. As used herein, the singular forms "a" and "an" are intended to include the plural forms, including "at least one," unless the content clearly indicates otherwise. "Or" means "and/or." It will be further understood that the terms "comprises," "comprising," "includes," "including," "has," or "having," when used in this specification, specify the presence of stated features, regions, elements, and/or components but do not preclude the presence or addition of one or more other features, regions, elements, components, and/or groups thereof.

Spatially relative terms, such as "under," "beneath," "below," "lower," "above," "upper," "over," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the exemplary term "below" can encompass both an orientation of above and below. The device may be otherwise oriented (e.g., rotated 90 degrees or at other orientations) and the spatially relative descriptors used herein shall be interpreted accordingly. It will be understood that, although the terms first, second, etc. may be used herein to describe various elements, components, regions, layers, and/or sections, these elements, components, regions, layers, and/or sections should not be limited by these terms. These terms are used to distinguish one element, component, region, layer, or section from another component, region, layer, or section. Thus, a first element, component, region, layer, or section discussed below could be termed a second element, component, region, layer, or section without departing from the teachings herein. Further, the use of "may" when describing embodiments of the present invention relates to "one or more embodiments of the present invention."

Exemplary embodiments are described herein with reference to cross-sectional illustrations and/or plan illustrations that are idealized exemplary illustrations. In the drawings, the thicknesses of layers and regions may be exaggerated for clarity. Accordingly, variations from the shapes of the illustrations as a result of, for example, manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle may have rounded or curved features. Thus, the regions illustrated in the figures are schematic in nature and their shapes are not intended to illustrate the actual shape of a region of a device and are not intended to limit the scope of the exemplary embodiments.

Figure 2A:
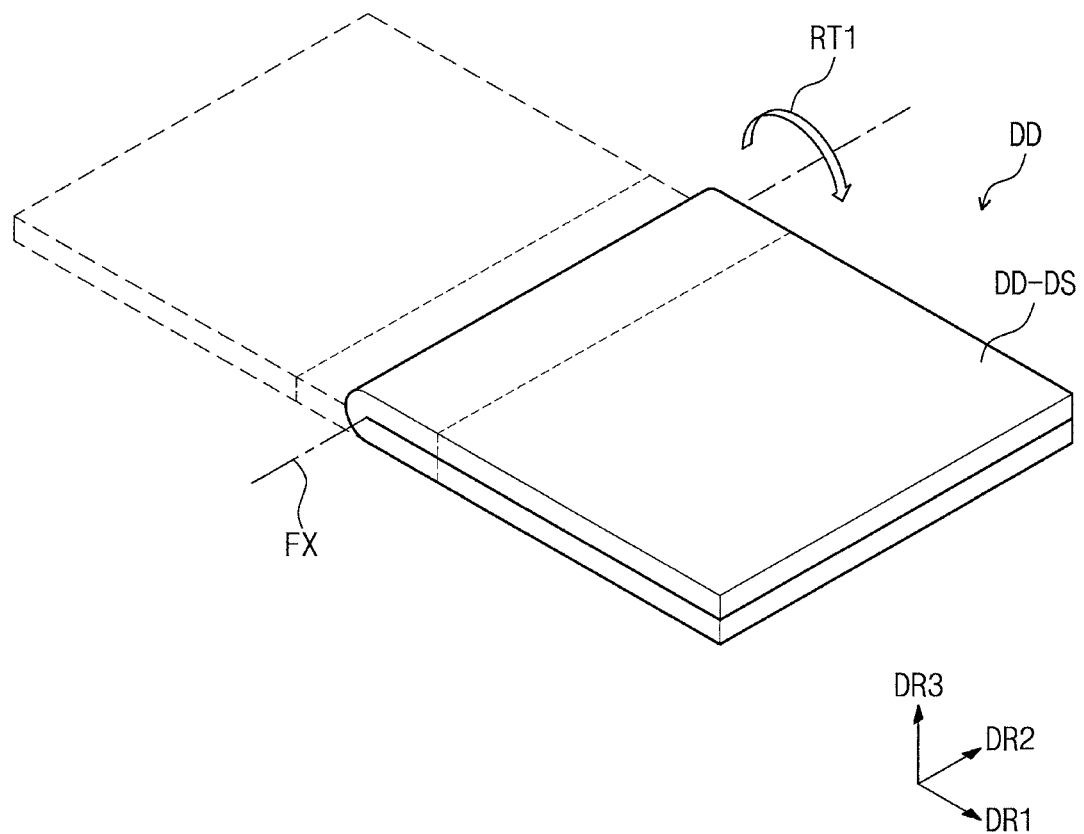
FIG. 2A is a perspective view of the display device shown in FIG. 1 folded in a first direction with respect to a folding axis.
Figure 2B:
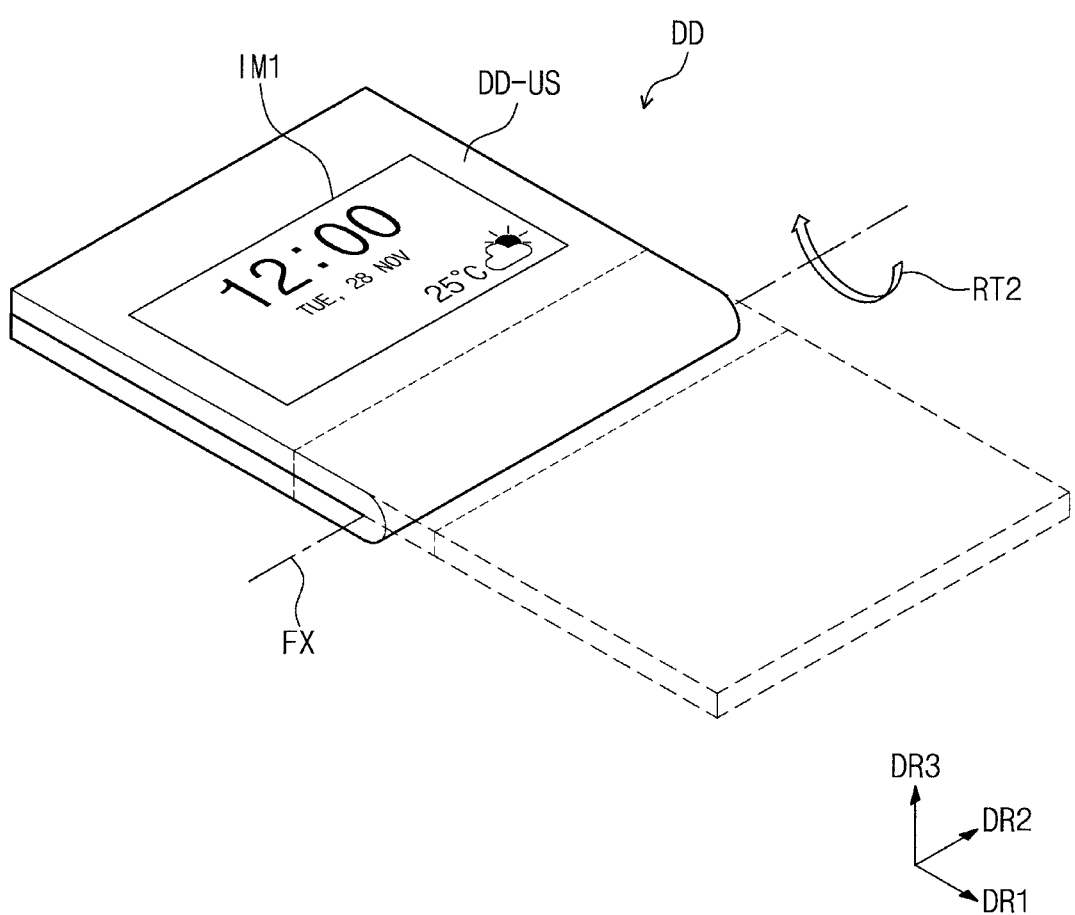
FIG. 2B is a perspective view of the display device shown in FIG. 1 folded in a second direction with respect to the folding axis.

FIG. 1 is a perspective view illustrating a display device according to an embodiment of the present invention. FIG. 2A is a perspective view illustrating the display device shown in FIG. 1 folded in a first direction with respect to a folding axis, and FIG. 2B is a perspective view illustrating the display device shown in FIG. 1 folded in a second direction with respect to the folding axis.

A foldable display device is illustrated as an example of a display device DD according to embodiments of the present invention. However, embodiments of the present invention are not limited thereto. The display device DD may also be applied to other various suitable display devices, such as a curved display device, a bendable display device, a rollable display device, and a stretchable display device. In addition, the display device DD according to embodiments of the present invention may be applied to relatively large-sized electronic devices (e.g., a television, an external billboard, etc.) as well as small and middle-sized electronic devices (e.g., a portable phone, a personal computer, a notebook computer, a personal digital terminal, a car navigation unit, a game console, a portable electronic device, a watch-type electronic device, a camera, etc.).

Referring to FIG. 1, the display device DD may include a plurality of areas defined on a display surface. The display device DD may include a display area DA and a non-display area NDA. The display area DA may be an area in which an image is displayed, and the non-display area NDA may be an area which is adjacent to (e.g., surrounds a periphery of) the display area DA and in which an image is not displayed. For example, FIG. 1 illustrates an image IM that may be displayed by a smart phone. In an embodiment, the display area DA may have a quadrilateral shape (e.g., a rectangular shape). The non-display area NDA may be adjacent to the display area DA or may surround (e.g., surround the periphery of) the display area DA in a plan view. In some embodiments, the non-display area NDA may be omitted.

According to the embodiment shown in FIG. 1, the display device DD (e.g., a display surface of the display device DD) may be parallel to a plane defined by a first direction DR1 and a second direction DR2. A normal direction of the display device DD may be indicated by a third direction DR3. The third direction DR3 may indicate a thickness direction of the display device DD. A front surface and a rear surface of various members or components of the display device DD may be distinguished by the third direction DR3. However, the directions DR1, DR2, and DR3 may be relative concepts and may be changed into other directions.

A folding area FA, a first non-folding area NFA1, and a second non-folding area NFA2 may be defined in the display device DD. During a folding operation of the display device DD, the display device DD may be folded along a folding axis FX at the folding area FA and the first and second non-folding areas NFA1 and NFA2 may not be folded. The folding axis FX may be parallel to the second direction DR2. The first non-folding area NFA1 and the second non-folding area NFA2 may be disposed with the folding area FA interposed therebetween. For example, the first non-folding area NFA1 may extend from one end of the folding area FA in the first direction D1, and the second non-folding area NFA2 may extend from another end of the folding area FA in the first direction D1.

A top surface DD-US of the display device DD may include a first display surface overlapping with the folding area FA, a second display surface overlapping with the first non-folding area NFA1, and a third display surface overlapping with the second non-folding area NFA2. A bottom surface DD-DS of the display device DD may be opposite to the top surface DD-US. Each of the first-third display surfaces may display an image.

According to embodiments of the present invention, the display device DD may be foldable with respect to the folding axis FX in both directions (e.g., in opposite directions).

Referring to FIG. 2A, the display device DD may be folded at the folding area FA along the folding axis FX such that the second display surface and the third display surface face each other. In this case, the display device DD may be folded in a first rotational direction RT1 and the bottom surface DD-DS of the display device DD may be exposed to the outside. This is defined as inner folding. The first rotational direction RT1 may be a clockwise direction.

Referring to FIG. 2B, the display device DD may be folded at the folding area FA along the folding axis FX such that the second display surface and the third display surface are exposed to the outside. In this case, the display device DD may be folded in a second rotational direction RT2 and the top surface DD-US of the display device DD may be exposed to the outside. This is defined as outer folding. The second rotational direction RT2 may be a counterclockwise direction.

As described above, the display device DD may be folded along the folding axis FX such that the second display surface of the first non-folding area NFA1 faces the third display surface of the second non-folding area NFA2. In addition, the display device DD may be folded along the folding axis FX such that the second and third display surfaces of the first and second non-folding areas NFA1 and NFA2 face outwards.

Figure 3A:
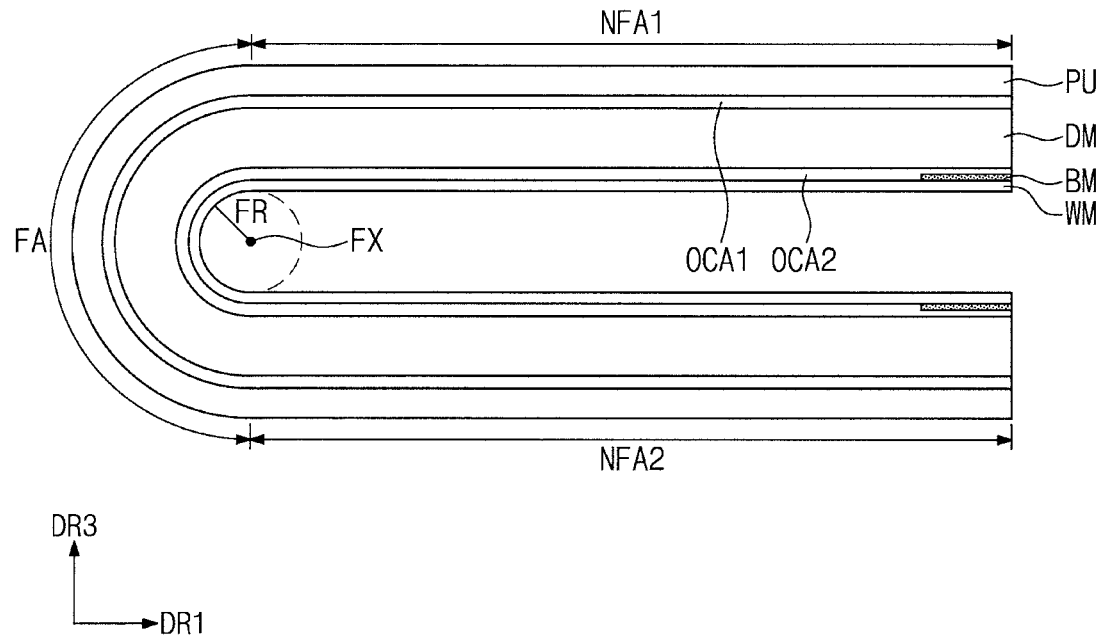
FIG. 3A is a cross-sectional view illustrating a display device in a folded state according to an embodiment of the present invention.
Figure 3B:
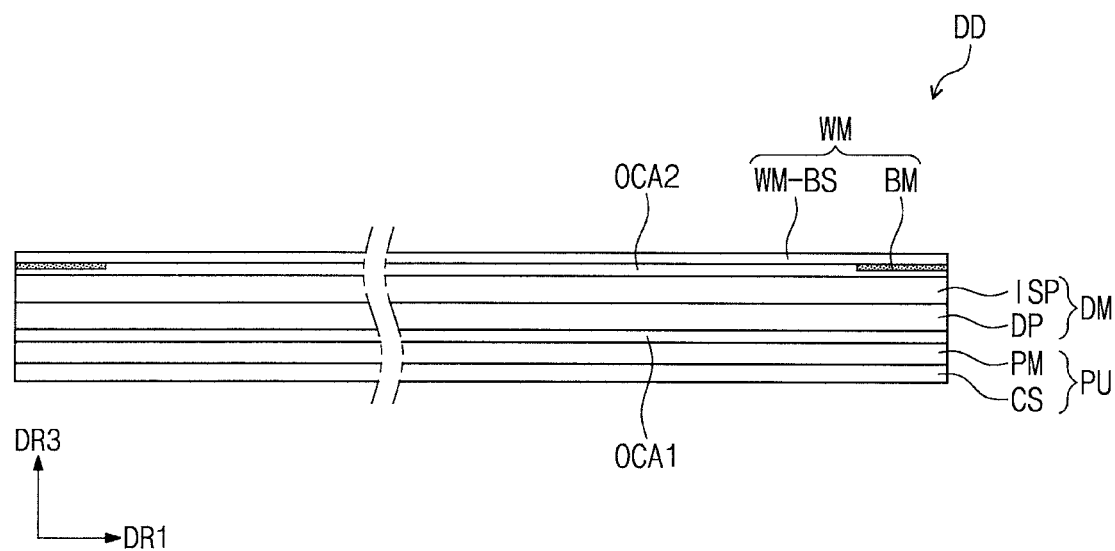
FIG. 3B is a cross-sectional view illustrating the display device in an unfolded state according to an embodiment of the present invention.
Figure 4A:
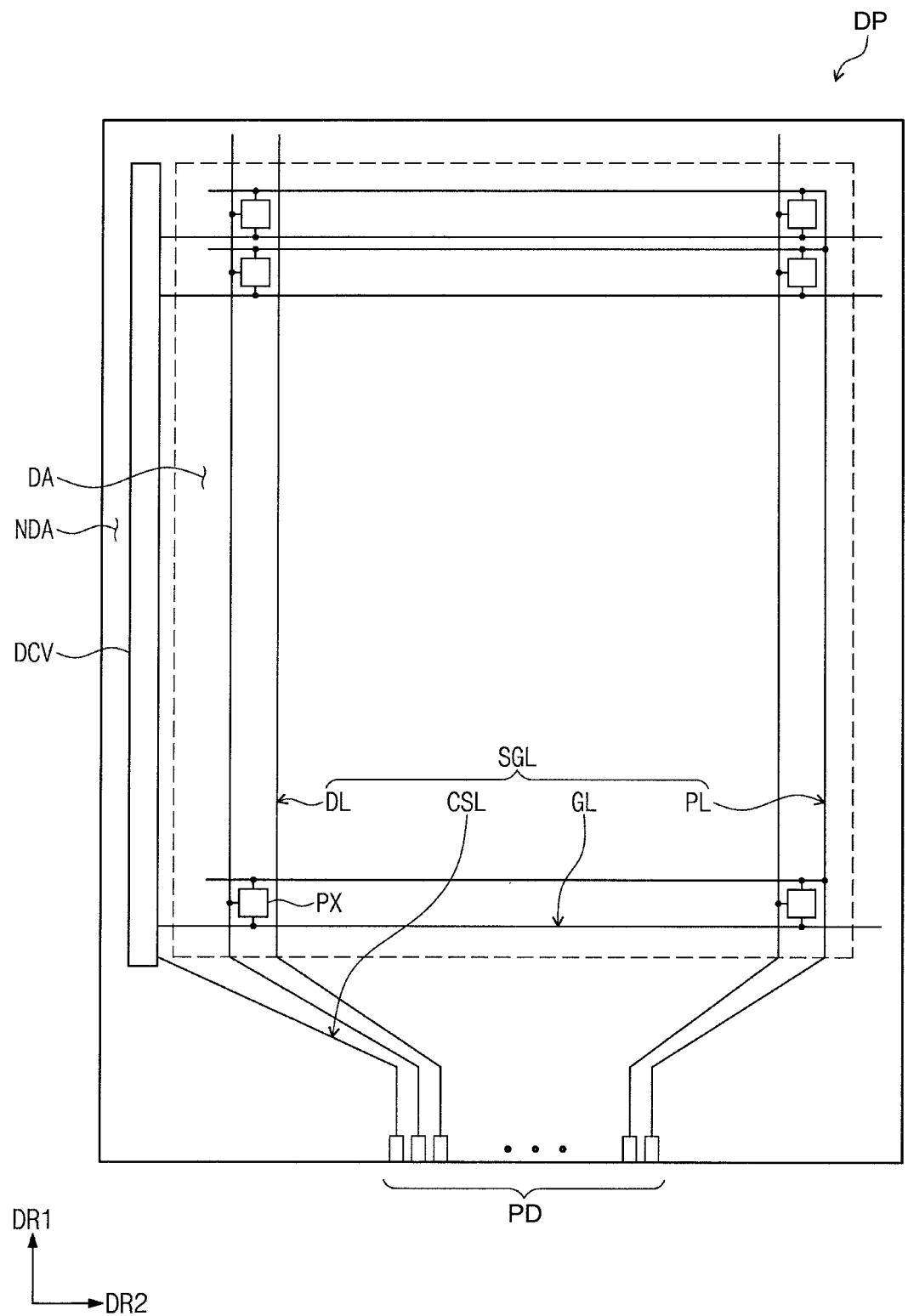
FIG. 4A is a plan view illustrating a display panel of the display device shown in FIGS. 3A and 3B.
Figure 4B:
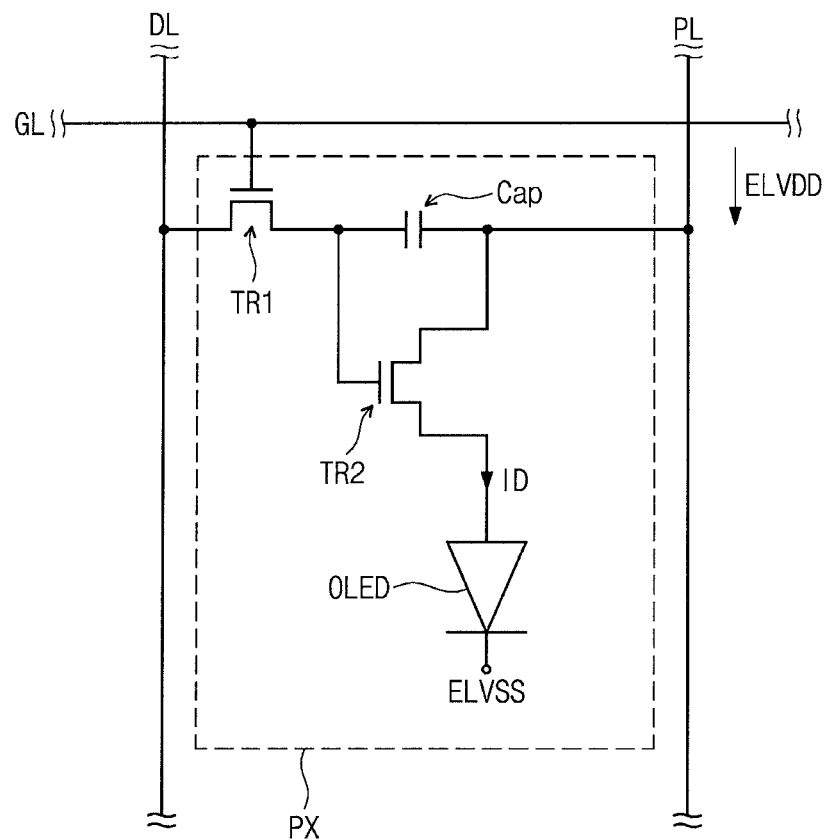
FIG. 4B is an equivalent circuit diagram of a pixel shown in FIG. 4A.

FIG. 3A is a cross-sectional view illustrating a display device in a folded state according to an embodiment of the present invention. FIG. 3B is a cross-sectional view illustrating the display device in an unfolded state according to an embodiment of the present invention. FIG. 4A is a plan view illustrating the display panel shown in FIG. 3. FIG. 4B is an equivalent circuit diagram of a pixel shown in FIG. 4A.

Referring to FIG. 3A, a display device DD in an inner-folded state is illustrated. When the display device DD is inner-folded, an inner space may be formed by a radius of curvature FR between the first and second non-folding areas NFA1 and NFA2 of the display device DD. According to embodiments of the present invention, the inner space may be formed when the display device DD is inner-folded and when it is outer-folded. However, embodiments of the present invention are not limited thereto. In some embodiments, the inner space may not be formed when the display device DD is inner-folded or outer-folded.

Referring to FIG. 3B, the display device DD may include a display module DM, a window member WM, and a protective layer PU. Each of the display module DM, the window member WM, and the protective layer PU may be flexible.

The display module DM may be disposed between the window member WM and the protective layer PU. The display module DM may display an image through the window member WM and/or may sense an external input through the window member WM. The display module DM may include a display panel DP and an input sensing unit (e.g., a touch panel) ISP. The display panel DP may be disposed on the protective layer PU, and the input sensing unit ISP may be disposed between the window member WM and the display panel DP.

The display panel DP may generate the image IM (see, e.g., FIG. 1) corresponding to inputted image data. The display panel DP may be a liquid crystal display panel, an organic light emitting display panel, an electrophoretic display panel, or an electrowetting display panel. However, the display panel DP is not limited to these examples. Hereinafter, the display panel DD will be described as the organic light emitting display panel, for example.

Referring to FIG. 4A, the display panel DP may include a plurality of signal lines SGL, a plurality of pixels PX, and a plurality of driving pads PD. An area in which the plurality of pixels PX is disposed may be defined as the display area DA.

The plurality of signal lines SGL may include gate lines GL, data lines DL, a power line PL, and a control signal line CSL. Each of the gate lines GL may be connected to corresponding ones of the plurality of pixels PX, and each of the data lines DL may be connected to corresponding ones of the plurality of pixels PX. The power line PL may be connected to the plurality of pixels PX. In addition, a gate driving circuit DCV to which the gate lines GL are connected may be disposed in the non-display area NDA. The control signal line CSL may provide control signals to the gate driving circuit DCV.

One or more of the gate lines GL, the data lines DL, the power line PL, and the control signal line CSL may be disposed on one layer, and another or others of the gate lines GL, the data lines DL, the power line PL and the control signal line CSL may be disposed on another layer different from the one layer. The signal lines SGL disposed on the one layer, from among the gate lines GL, the data lines DL, the power line PL, and the control signal line CSL, may be defined as first signal lines, and the signal lines SGL disposed on the other layer may be defined as second signal lines. The signal lines SGL disposed on still another layer may be defined as third signal lines.

The plurality of driving pads PD may be respectively electrically connected to the data lines DL, the power line PL, and the control signal line CSL. The driving pads PD may overlap with (e.g., may be arranged in) the non-display area NDA.

The pixel PX connected to one gate line GL, one data line DL, and the power line PL is illustrated as an example in FIG. 4B. However, the configuration of the pixel PX is not limited thereto and may be variously suitably modified.

The pixel PX may include an organic light emitting element OLED used as a display element. The organic light emitting element OLED may be a front surface light emission diode or a rear surface light emission diode. The pixel PX may include a first transistor (e.g., a switching transistor) TR1, a second transistor (e.g., a driving transistor) TR2, and a capacitor Cap, which together constitute a circuit for driving the organic light emitting element OLED. The organic light emitting element OLED may generate light by an electrical signal provided from the first and second transistors TR1 and TR2.

The first transistor TR1 may output a data signal applied to the data line DL in response to a scan signal applied to the gate line GL. The capacitor Cap may be charged with (e.g., may store) a voltage corresponding to the data signal received from the first transistor TR1.

The second transistor TR2 may be connected to the organic light emitting element OLED. The second transistor TR2 may control a driving current ID flowing through the organic light emitting element OLED in response to (e.g., according to) the charge stored in the capacitor Cap. The organic light emitting element OLED may emit light during a turn-on period of the second transistor TR2.

Referring again to FIG. 3B, the input sensing unit ISP may obtain information on coordinates of an input point. The input sensing unit ISP may be disposed on a front surface of the display panel DP. However, the positional relationship of the display panel DP and the input sensing unit ISP is not limited thereto. The input sensing unit ISP may be a contact type and/or non-contact type touch panel.

In different embodiments, the input sensing unit ISP may be integrated directly on the front surface of the display panel DP or may be disposed on the display panel DP with an adhesive member interposed therebetween. For example, the adhesive member may include an optically clear adhesive (OCA) film and/or a pressure sensitive adhesive (PSA).

The window member WM may be disposed on the display module DM. The window member WM may include a base member WM-BS and the black matrix BM. The black matrix BM may be disposed on a rear surface of the base member WM-BS to define a bezel area (e.g., the non-display area NDA shown in, for example, FIG. 1) of the display device DD. The base member WM-BS may include a glass substrate, a sapphire substrate, or a plastic film. The black matrix BM may be a colored organic layer and may be formed by, for example, a coating method. The window member WM may further include a functional coating layer disposed on a front surface of the base member WM-BS. The functional coating layer may include at least one of an anti-fingerprint layer, an anti-reflection layer, and/or a hard coating layer. In some embodiments, when an entire front surface of the display panel DP is provided as the display surface (e.g., as the display area DA), the black matrix BM may be omitted.

The protective layer PU may be disposed under the display module DM to support and/or protect the display module DM. The protective layer PU may include a protective member PM disposed under the display module DM and a cushion CS disposed under the protective member PM.

The protective member PM may support (e.g., may support the hardness of) the window member WM when the display device DD is inner-folded or outer-folded. For example, the protective member PM may include a metal or a polymer material. Increased thickness of the protective member PM may increase the stiffness of the window member WM. As the thickness of the protective member PM increases, stress applied to the protective member PM overlapping with the folding area FA may be correspondingly increased when the display device DD is inner-folded or outer-folded. If the stress applied to the protective member PM overlapping with the folding area FA during the inner folding or outer folding of the display device DD is greater than its critical tensile strength, the protective member PM may break (e.g., may crack).

However, according to embodiments of the present invention, a thickness of the protective member PM in the folding area FA may be different from a thickness of the protective member PM in the non-folding areas NFA1 and NFA2. For example, the thickness of the protective member PM in the folding area FA may be reduced (e.g., may be less than the thickness of the protective member PM overlapping with the non-folding areas NFA1 and NFA2), and thus, the stress applied to the protective member PM in the folding area FA may be reduced. This will be described later in more detail with reference to FIG. 5.

The display module DM and the protective member PM may be coupled to each other by a first adhesive member OCA1 interposed therebetween. In addition, the window member WM and the display module DM may be coupled to each other by a second adhesive member OCA2 interposed therebetween. The first and second adhesive members OCA1 and OCA2 may be optically clear adhesive (OCA) films. However, embodiments of the present invention are not limited thereto. In other embodiments, one or both of the first and second adhesive members OCA1 and OCA2 may be pressure sensitive adhesives (PSA).

The cushion CS may protect the window member WM and the display module DM from an external impact.

Figure 5:
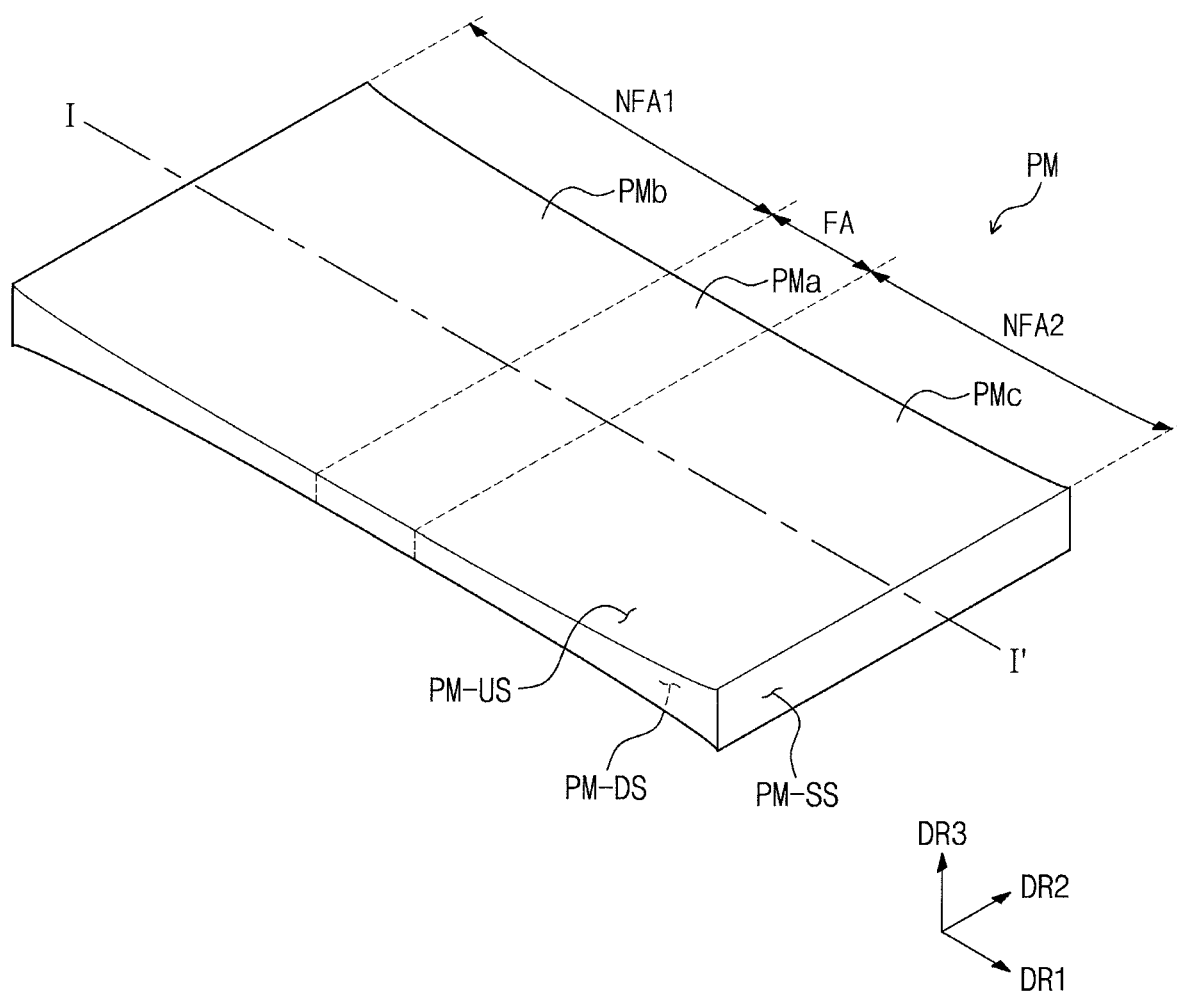
FIG. 5 is a perspective view illustrating a protective member according to an embodiment of the present invention.
Figure 6:
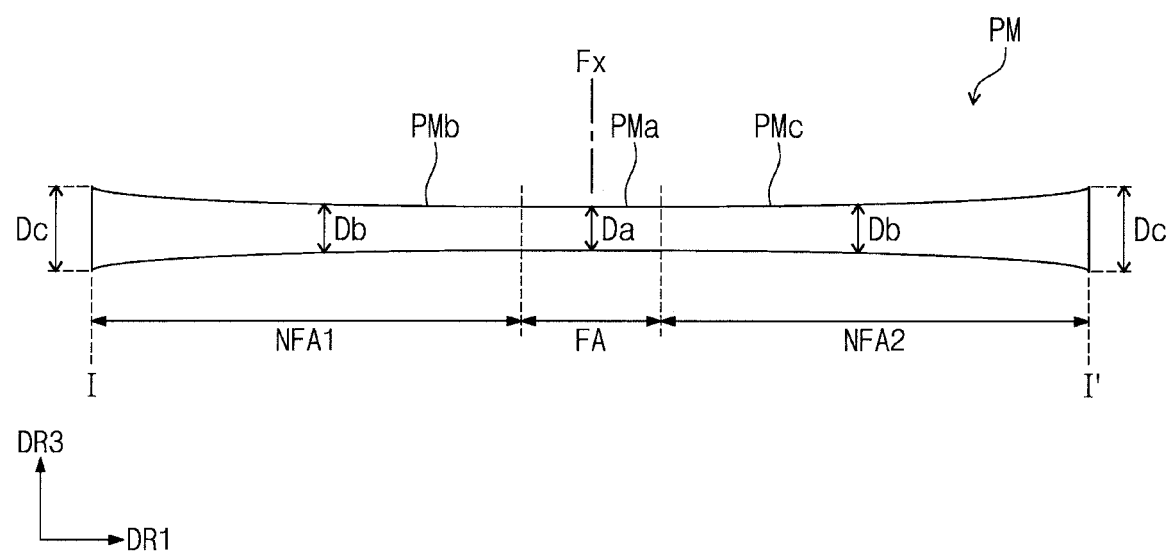
FIG. 6 is a cross-sectional view taken along the line I-I' of FIG. 5.

FIG. 5 is a perspective view illustrating a protective member according to an embodiment of the present invention. FIG. 6 is a cross-sectional view taken along the line I-I' of FIG. 5.

Referring to FIGS. 5 and 6, the protective member PM may include a first protective portion PMa overlapping with the folding area FA, a second protective portion PMb overlapping with the first non-folding area NFA1, and a third protective portion PMc overlapping with the second non-folding area NFA2. In addition, the protective member PM may have a top surface PM-US, a bottom surface PM-DS, and side surfaces PM-SS.

According to embodiments of the present invention, a thickness of the first protective portion PMa overlapping with the folding area FA may be less than a thickness of the second protective portion PMb overlapping with the first non-folding area NFA1 and a thickness of the third protective portion PMc overlapping with the second non-folding area NFA2.

As described above, the stress applied to the first protective portion PMa overlapping with the folding area FA increases when the display device DD is inner-folded or outer-folded. However, because the thickness of the first protective portion PMa is relatively thin, the stress applied to the first protective portion PMa may be reduced as compared with stress applied to a conventional protective member that has a uniform thickness (e.g., a uniform thickness in areas overlapping with the folding area and in the non-folding area(s)).

As shown in FIG. 6, the top surface PM-US of the protective member PM may have a concave shape recessed toward the bottom surface PM-DS when viewed in a cross-sectional view perpendicular to the second direction DR2 (e.g., a cross-sectional view defined by the first and third directions DR1 and DR3). The bottom surface PM-DS of the protective member PM may have a concave shape recessed toward the top surface PM-US when viewed in the cross-sectional view perpendicular to the second direction DR2. In FIG. 6, the second direction DR2 may be parallel to the folding axis FX, and the third direction DR3 may be parallel to the thickness direction of the display module DM.

The thickness of the protective member PM overlapping with the first non-folding area NFA1 may increase as a distance from the folding area FA increases when viewed in the cross-sectional view perpendicular to the second direction DR2, and the thickness of the protective member PM overlapping with the second non-folding area NFA2 may increase as a distance from the folding area FA increases when viewed in the cross-sectional view perpendicular to the second direction DR2.

For example, the first protective portion PMa may have a first thickness Da in the third direction DR3. In an embodiment, the first thickness Da of the first protective portion PMa may be uniform or substantially uniform. However, embodiments of the present invention are not limited thereto. In another embodiment, the first thickness Da of the first protective portion PMa may decrease as a distance from the folding axis FX in the first direction DR1 decreases.

A central portion of each of the second and third protective portions PMb and PMc may have a second thickness Db in the third direction DR3. The first thickness Da may be less than the second thickness Db. Both edges of the protective member PM in the first direction DR1 may have a third thickness Dc in the third direction DR3. The second thickness Db may be less than the third thickness Dc.

As described above, the protective member PM according embodiments of the present invention may be thinner in the folding area FA than in the non-folding areas NFA1 and NFA2. As a result, the window member WM may be supported by the protective member PM and folding reliability of the display device DD may be improved.

Figure 7A:
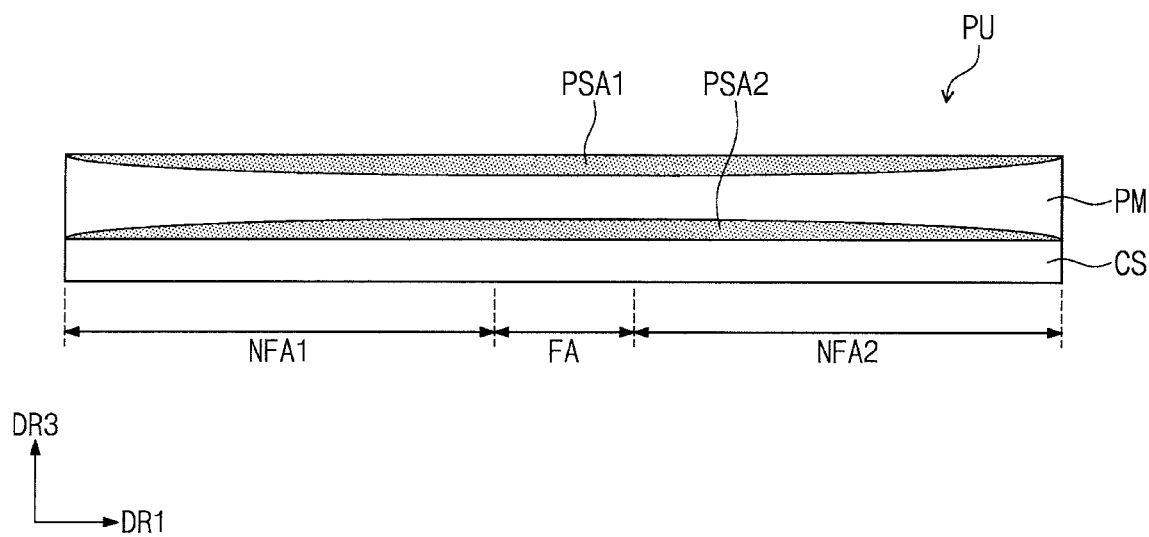
FIG. 7A is a cross-sectional view illustrating a protective layer according to an embodiment of the present invention.
Figure 7B:
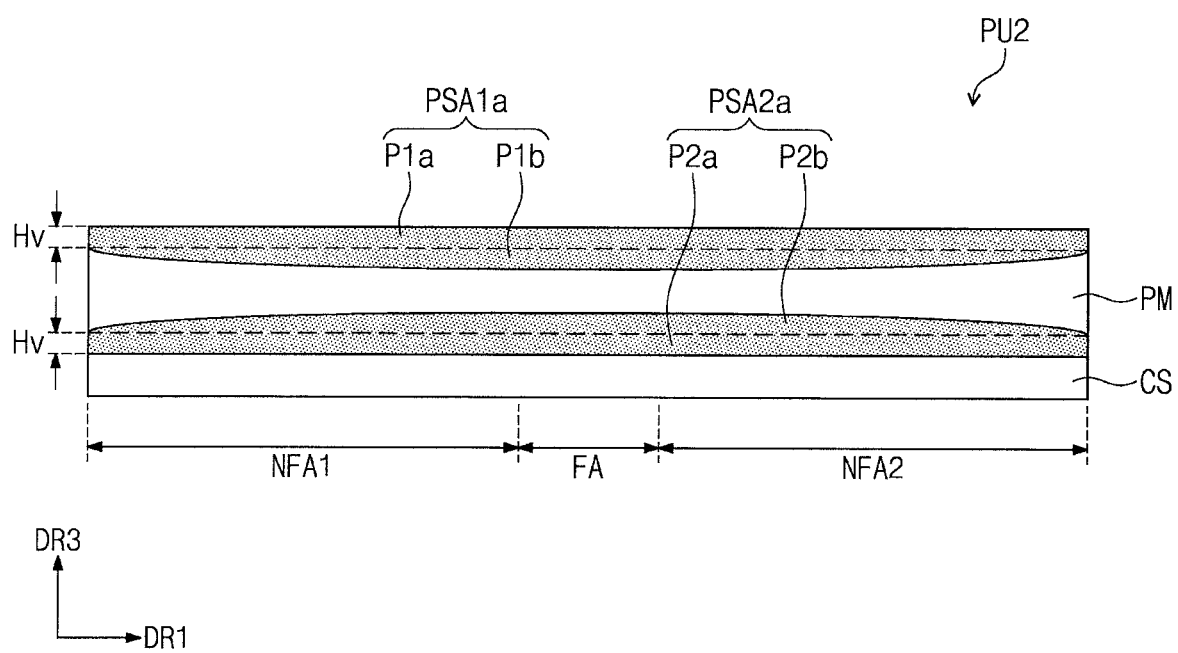
FIG. 7B is a cross-sectional view illustrating a protective layer according to another embodiment of the present invention.

FIG. 7A is a cross-sectional view illustrating a protective layer according to an embodiment of the present invention. FIG. 7B is a cross-sectional view illustrating a protective layer according to another embodiment of the present invention.

Referring to FIG. 7A, a protective layer PU may include a protective member PM, a cushion CS, a first adhesive PSA1, and a second adhesive PSA2. The protective member PM may have the same or substantially the same structure as the protective member PM described above with reference to FIGS. 5 and 6.

The first adhesive PSA1 may be disposed between the display module DM and the protective member PM. For example, the first adhesive PSA1 may be disposed in a recessed space defined by the top surface PM-US of the protective member PM. A bottom surface of the first adhesive PSA1 may have a curved surface shape and may be disposed on the top surface PM-US of the protective member PM. A top surface of the first adhesive PSA1 may have a flat surface shape and may be adhered to the first adhesive member OCA1 (see, e.g., FIG. 3B).

In the above descriptions of embodiments of the present invention, the first adhesive PSA1 and the first adhesive member OCA1 are described as separate components. However, embodiments of the present invention are not limited thereto. In another embodiment, the first adhesive member OCA1 show in FIG. 3B may be replaced with the first adhesive PSA1. For example, the first adhesive member OCA1 may be omitted. In such an embodiment, the top surface of the first adhesive PSA1 may be adhered directly to the display module DM.

The second adhesive PSA2 may be disposed between the protective member PM and the cushion CS. For example, the second adhesive PSA2 may be disposed in a recessed space defined by the bottom surface PM-DS of the protective member PM. A top surface of the second adhesive PSA2 may have a curved surface shape and may be disposed on the bottom surface PM-DS of the protective member PM. A bottom surface of the second adhesive PSA2 may have a flat surface shape and may be adhered to the cushion CS.

According to an embodiment of the present invention, the first and second adhesives PSA1 and PSA2 may be integrally formed with the protective member PM as a single unit. Thus, it may be relatively easy to perform a process of adhering the protective layer PU to the display module DM.

Referring to FIG. 7B, a protective layer PU2 may include first and second adhesives different from the first and second adhesives PSA1 and PSA2 of the protective layer PU shown in FIG. 7A, but other components of the protective layer PU2 may be the same or substantially the same as corresponding components of the protective layer PU shown in FIG. 7A. Thus, the descriptions to the other components of the protective layer PU2 may be omitted.

The protective layer PU2 may include the protective member PM, a first adhesive PSA1a, a second adhesive PSA2a, and the cushion CS.

The first adhesive PSA1a may include a first adhesive portion P1b which is disposed in the recessed space defined by the top surface PM-US of the protective member PM and a second adhesive portion P1a which has a constant (or uniform) thickness Hv in the third direction DR3 and extends from (e.g., is adhered on) the first adhesive portion P1b. In an embodiment, the first adhesive member OCA1 shown in FIG. 3B may be replaced with the second adhesive portion P1a.

The second adhesive PSA2a may include a third adhesive portion P2b which is disposed in the recessed space defined by the bottom surface PM-DS of the protective member PM and a fourth adhesive portion P2a which has a constant (or uniform) thickness Hv in the third direction DR3 and extends from (e.g., is adhered on) the third adhesive portion P2b. The fourth adhesive portion P2a may be adhered to the cushion CS.

Similar to the embodiment shown in FIG. 7A, the first and second adhesives PSA1a and PSA2a may be integrally formed with the protective member PM as a single unit. Thus, it may be relatively easy to perform a process of adhering the protective layer PU2 to the display module DM.

Figure 8A:
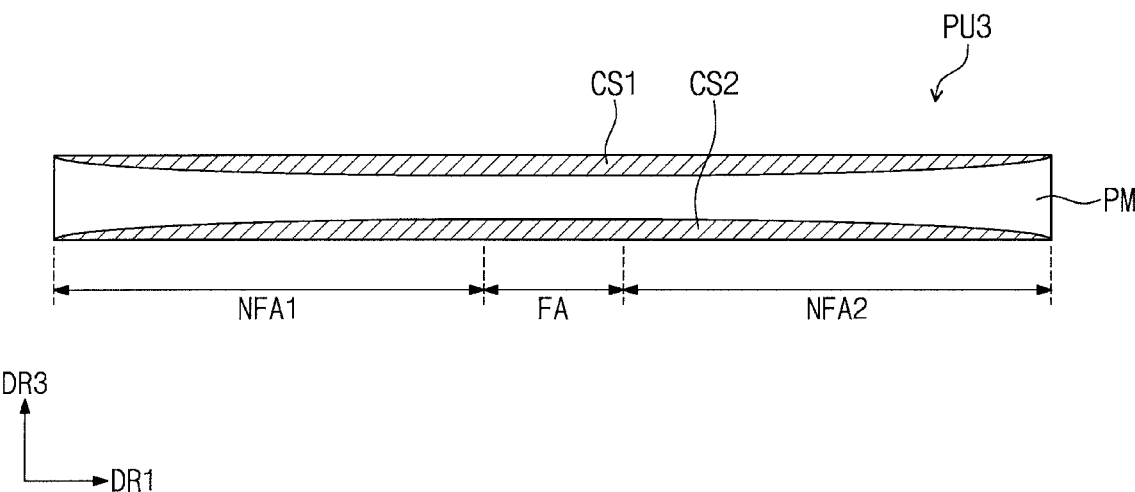
FIG. 8A is a cross-sectional view illustrating a protective layer according to another embodiment of the present invention.
Figure 8B:
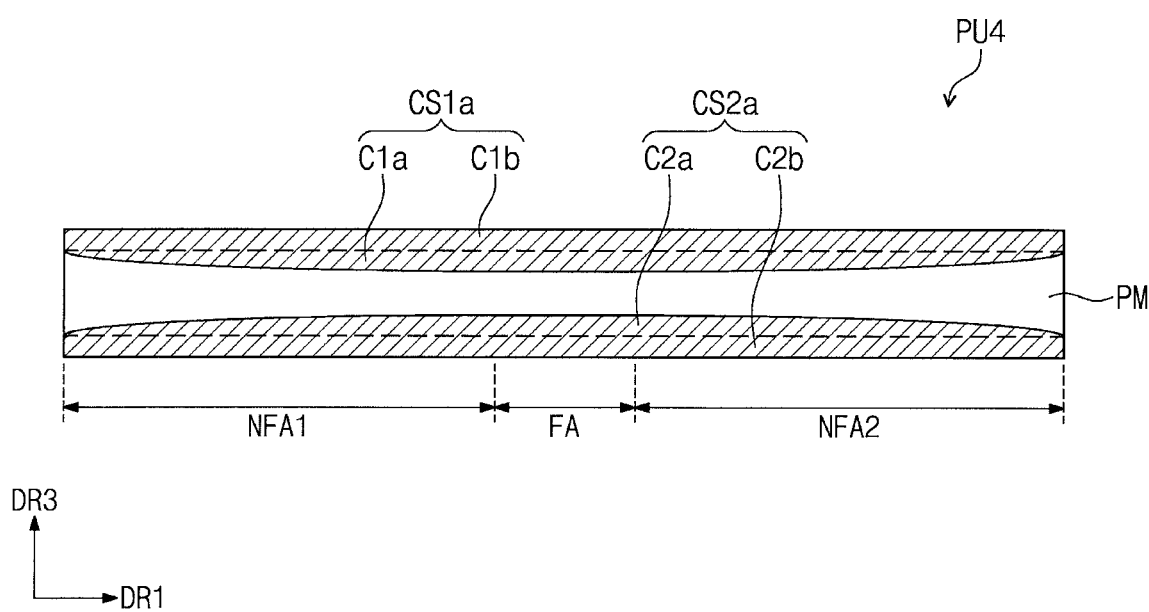
FIG. 8B is a cross-sectional view illustrating a protective layer according to another embodiment of the present invention.

FIG. 8A is a cross-sectional view illustrating a protective layer according to another embodiment of the present invention. FIG. 8B is a cross-sectional view illustrating a protective layer according to another embodiment of the present invention.

Referring to FIG. 8A, a protective member PM of a protective layer PU3 may be the same or substantially the same as the protective member PM of the protective layer PU shown in FIG. 7A. Thus, the description thereof may be omitted.

The protective layer PU3 may include the protective member PM, a first cushion CS1, and a second cushion CS2. The first cushion CS1 may be disposed between the first adhesive member OCA1 (see, e.g., FIG. 3B) and the protective member PM. For example, the first cushion CS1 may be disposed in the recessed space defined by the top surface PM-US of the protective member PM. A bottom surface of the first cushion CS1 may have a curved surface shape and may be disposed on the top surface PM-US of the protective member PM. A top surface of the first cushion CS1 may have a flat surface shape and may be adhered to the first adhesive member OCA1. In an embodiment, an adhesive may be disposed between the first cushion CS1 and the top surface PM-US of the protective member PM.

The second cushion CS2 may be disposed on the bottom surface PM-DS of the protective member PM. For example, the second cushion CS2 may be disposed in the recessed space defined by the bottom surface PM-DS of the protective member PM. A top surface of the second cushion CS2 may have a curved surface shape and may be disposed on the bottom surface PM-DS of the protective member PM. A bottom surface of the second cushion CS2 may have a flat surface shape. In an embodiment, an adhesive may be disposed between the second cushion CS2 and the bottom surface PM-DS of the protective member PM.

According to an embodiment of the present invention, the first and second cushions CS1 and CS2 may be integrally formed with the protective member PM as a single unit. Thus, it may be relatively easy to perform a process of adhering the protective layer PU3 to the display module DM.

Referring to FIG. 8B, a protective layer PU4 may include first and second cushions different from the first and second cushions CS1 and CS2 of the protective layer PU3 shown in FIG. 8A but may include a protective member which is the same or substantially the same as the protective member PM of the protective layer PU3 shown in FIG. 8A.

The protective layer PU4 may include the protective member PM, a first cushion CS1a, and a second cushion CS2a. The first cushion CS1a may include a first cushion portion C1a disposed in the recessed space defined by the top surface PM-US of the protective member PM and a second cushion portion C1b which has a constant (or uniform) thickness in the third direction D3 and extends from (e.g., is adhered to) the first cushion portion C1a.

The second cushion CS2a may include a third cushion portion C2a which is disposed in the recessed space defined by the bottom surface PM-DS of the protective member PM, and a fourth cushion portion C2b which has a constant (or uniform) thickness in the third direction D3 and extends from (e.g., is adhered to) the third cushion portion C2a.

Similar to the embodiment of FIG. 8A, the first and second cushions CS1a and CS2a may be integrally formed with the protective member PM as a single unit. Thus, it may be relatively easy to perform a process of adhering the protective layer PU4 to the display module DM.

Figure 9A:
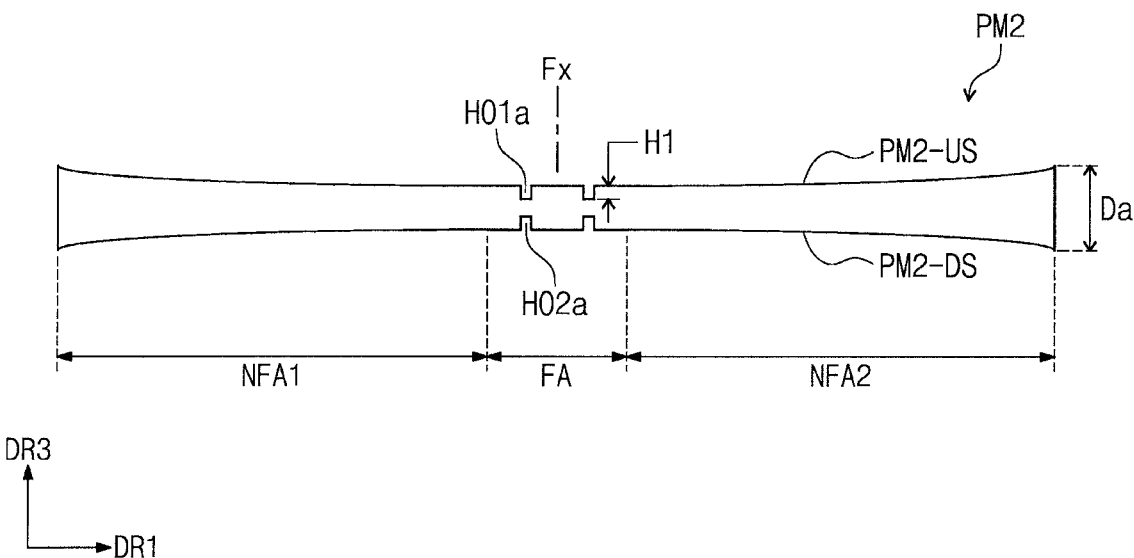
FIG. 9A is a cross-sectional view illustrating a protective member according to another embodiment of the present invention.
Figure 9B:
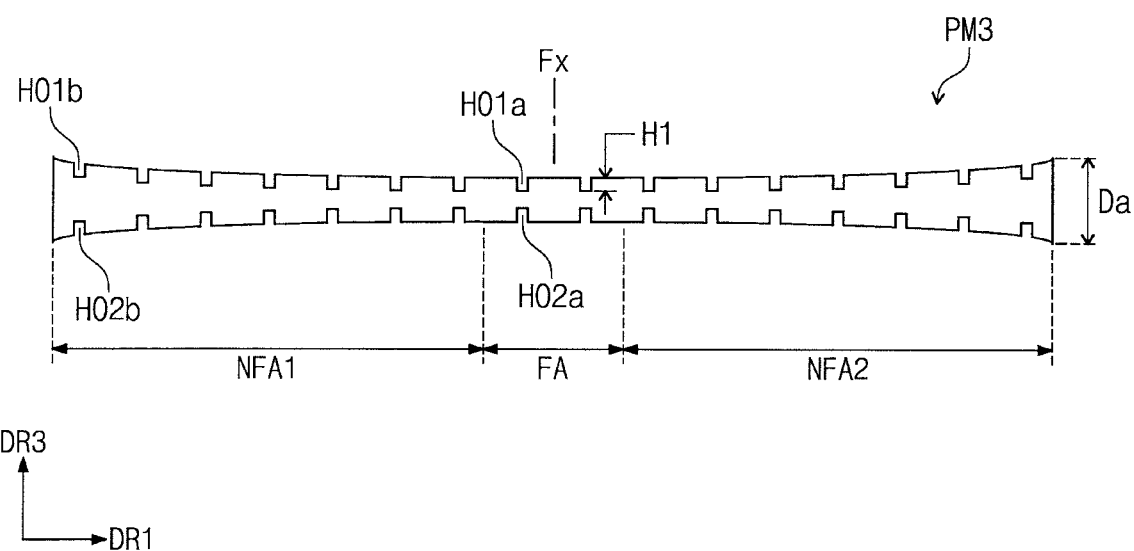
FIG. 9B is a cross-sectional view illustrating a protective member according to another embodiment of the present invention.

FIG. 9A is a cross-sectional view illustrating a protective member according to another embodiment of the present invention. FIG. 9B is a cross-sectional view illustrating a protective member according to another embodiment of the present invention.

Referring to FIG. 9A, a top surface PM2-US of a protective member PM2 may include a first opening (e.g., a first groove or a first hole) H01a which overlaps with the folding area FA and is recessed toward a bottom surface PM2-DS in the third direction DR3. A depth of the first opening H01a may be a first length H1.

The bottom surface PM2-DS of the protective member PM2 may include a second opening (e.g., a second groove or a second hole) H02a which overlaps with the folding area FA and is recessed toward the top surface PM2-US in the third direction DR3. A depth of the second opening H02a may be the first length H1, that is, equal to or substantially equal to the depth of the first opening H01a. However, embodiments of the present invention are not limited thereto. In another embodiment, the depth of the first opening H01a may be different from the depth of the second opening H02a.

As a result, when the display device DD is inner-folded or outer-folded, stress applied to the protective member PM2 overlapping with the folding area FA may be reduced due to the first opening H01a included in the top surface PM2-US and the second opening H02a included in the bottom surface PM2-DS.

Referring to FIG. 9B, a top surface PM3-US of a protective member PM3 may include a third opening (e.g., a third groove or a third hole) H01b which overlaps with the first non-folding area NFA1 or the second non-folding area NFA2 and is recessed toward a bottom surface PM3-DS in the third direction DR3. The bottom surface PM3-DS of the protective member PM3 may include a fourth opening (e.g., a fourth groove or a fourth hole) H02b which overlaps with the first non-folding area NFA1 or the second non-folding area NFA2 and is recessed toward the top surface PM3-US in the third direction DR3.

In an embodiment, depths of the first-fourth holes H01a-H02b in the third direction DR3 may be equal or substantially equal to each other. However, embodiments of the present invention are not limited thereto. In other embodiments, the depths of the first-fourth holes H01a-H02b may be different from each other.

Figure 10:
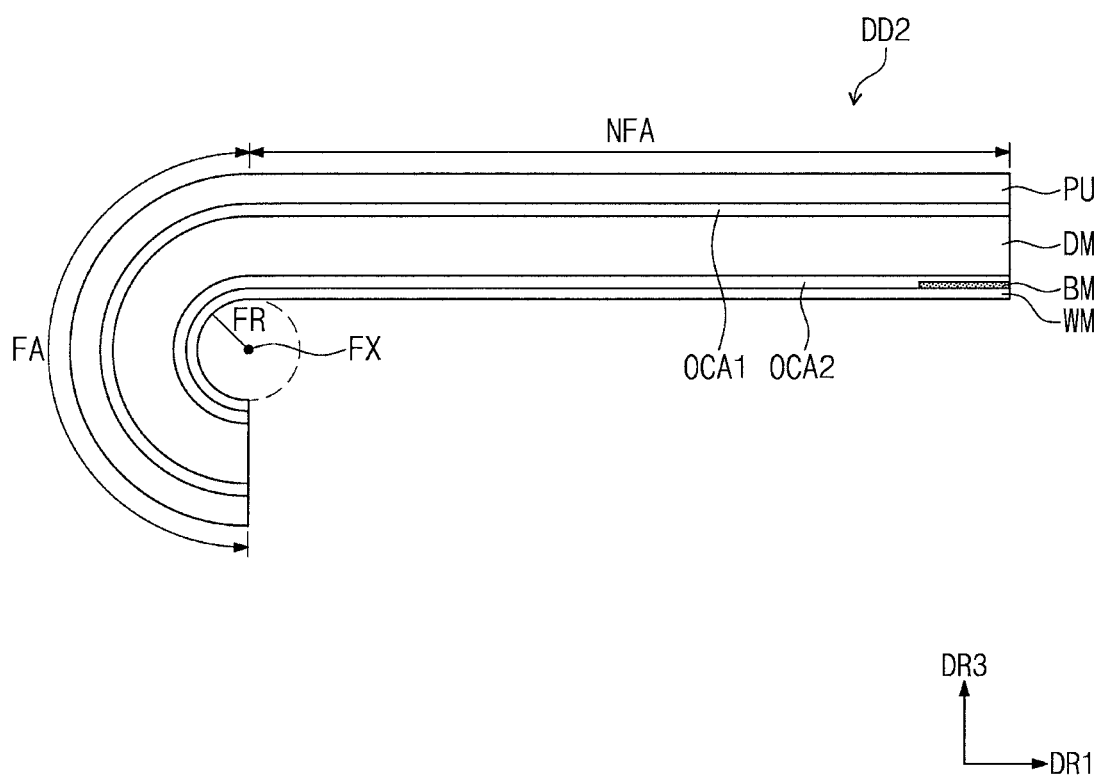
FIG. 10 is a cross-sectional view illustrating a display device in a folded state according to another embodiment of the present invention.

FIG. 10 is a cross-sectional view illustrating a display device in a folded state according to another embodiment of the present invention.

The second non-folding area NFA2 may be omitted in a display device DD2 shown in FIG. 10 as compared with the display device DD shown in FIG. 3A. Components of the display device DD2 shown in FIG. 10 may be the same or substantially the same as corresponding components of the display device DD shown in FIG. 3A.

For example, the display device DD2 may include a folding area FA folded along a folding axis FX and a non-folding area NFA extending from the folding area FA. The display module DM may display an image through each of the folding area FA and the non-folding area NFA. The protective layer PU may be one of the protective layers according to the embodiments described above with reference to FIGS. 5-9B.

According to embodiments of the present invention, the thickness of the protective member overlapping with the folding area may be less than the thickness of the protective member overlapping with the non-folding area(s). Thus, the stress applied to the protective member overlapping with the folding area may be reduced.

Accordingly, it is possible to prevent or reduce the occurrence of the protective member overlapping with the folding area breaking or cracking when the display device is folded.

While the present invention has been described with reference to example embodiments, it will be apparent to those skilled in the art that various changes and modifications may be made therein without departing from the spirit and scope of the present invention. Therefore, it should be understood that the above embodiments are not limiting but illustrative. Thus, the scope of the present invention is to be determined by the broadest permissible interpretation of the following claims and their equivalents and shall not be restricted or limited by the foregoing description.

What is claimed is:

1. A display device comprising:
   a display module comprising:
      a folding area foldable along a folding axis;
      a first non-folding area; and
      a second non-folding area, the folding area being between the first and second non-folding areas;
   a protective member under the display module; and
   an adhesive member between the display module and the protective member,
   wherein a first thickness of the protective member overlapping with the folding area is less than a second thickness of the protective member overlapping with the first non-folding area and a third thickness of the protective member overlapping with the second non-folding area,
   wherein the protective member comprises: a first surface facing the display module; a second surface opposite to the first surface; and side surfaces extending between the first surface and the second surface, and
   wherein the first surface has a concave shape recessed toward the second surface when viewed in a cross-sectional view perpendicular to the folding axis.

2. The display device of claim 1, wherein the second surface has a concave shape recessed toward the first surface when viewed in the cross-sectional view.

3. The display device of claim 2, further comprising:
   a first adhesive in a recessed space defined by the first surface; and
   a second adhesive in a recessed space defined by the second surface.

4. The display device of claim 3, wherein the first adhesive is integral with the adhesive member.

5. The display device of claim 3, wherein the first adhesive comprises:
   a first adhesive portion in the recessed space defined by the first surface; and
   a second adhesive portion comprising a substantially uniform thickness and extending from the first adhesive portion,
   wherein the second adhesive comprises:
      a third adhesive portion in the recessed space defined by the second surface; and
      a fourth adhesive portion comprising a substantially uniform thickness and extending from the third adhesive portion, and
   wherein the second adhesive portion is the adhesive member.

6. The display device of claim 3, further comprising a cushion under the second adhesive.

7. The display device of claim 2, further comprising:
   a first cushion in a recessed space defined by the first surface; and
   a second cushion in a recessed space defined by the second surface.

8. The display device of claim 7, wherein the first cushion comprises:
   a first cushion portion in the recessed space defined by the first surface; and
   a second cushion portion comprising a substantially uniform thickness and extending from the first cushion portion in a thickness direction of the display module.

9. The display device of claim 2, wherein the first surface comprises a first opening overlapping with the folding area and recessed in a thickness direction of the display module.

10. The display device of claim 9, wherein the first surface comprises a second opening overlapping with the first non-folding area or the second non-folding area and recessed in the thickness direction.

11. The display device of claim 9, wherein the second surface comprises a second opening overlapping with the folding area and recessed in the thickness direction.

12. The display device of claim 1, wherein the second thickness of the protective member overlapping with the first non-folding area increases as a distance from the folding area increases when viewed in a cross-sectional view perpendicular to the folding axis, and
   wherein the third thickness of the protective member overlapping with the second non-folding area increases as a distance from the folding area increases when viewed in the cross-sectional view.

13. The display device of claim 1, wherein the display module comprises:
   a first display surface overlapping with the folding area;
   a second display surface overlapping with the first non-folding area; and
   a third display surface overlapping with the second non-folding area.

14. The display device of claim 13, wherein the display module is configured to be folded at the folding area along the folding axis such that the second display surface and the third display surface face each other.

15. The display device of claim 13, wherein the display module is configured to be folded at the folding area along the folding axis such that the second display surface and the third display surface are exposed to an outside.

16. The display device of claim 1, wherein the protective member overlapping with the folding area has a substantially uniform thickness in a thickness direction of the display module.

17. A display device comprising a folding area foldable along a folding axis and a non-folding area, the display device comprising:
   a display module comprising a first display surface overlapping with the folding area and a second display surface overlapping with the non-folding area;
   a protective member under the display module and comprising a first surface, a second surface, and side surfaces;
   a first adhesive member between the display module and the first surface of the protective member;
   a window member on the display module; and
   a second adhesive member between the window member and the display module,
   wherein each of the first surface and the second surface of the protective member has a concave shape when viewed in a cross-sectional view perpendicular to the folding axis.

18. The display device of claim 17, wherein the display module comprises:
   a display panel configured to display first and second images at the first and second display surfaces, respectively; and
   an input sensing unit on the display panel.

19. The display device of claim 17, wherein the non-folding area comprises a first non-folding area and a second non-folding area, and
   wherein the folding area is between the first and second non-folding areas.

* * * * *